US008054602B2

(12) United States Patent
Takahashi

(10) Patent No.: US 8,054,602 B2
(45) Date of Patent: Nov. 8, 2011

(54) POWER SUPPLY CONTROLLER

(75) Inventor: Seiji Takahashi, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 101 days.

(21) Appl. No.: 12/227,232

(22) PCT Filed: May 29, 2007

(86) PCT No.: PCT/JP2007/060901
§ 371 (c)(1),
(2), (4) Date: Sep. 9, 2009

(87) PCT Pub. No.: WO2007/139108
PCT Pub. Date: Dec. 6, 2007

(65) Prior Publication Data
US 2010/0014195 A1 Jan. 21, 2010

(30) Foreign Application Priority Data
Jun. 1, 2006 (JP) .................... 2006-153704

(51) Int. Cl.
*H02H 3/08* (2006.01)
(52) U.S. Cl. .................. 361/93.1; 361/87; 361/101
(58) Field of Classification Search ........... 361/31, 361/87, 93.1, 100, 101; 323/277
See application file for complete search history.

(56) References Cited

U.S. PATENT DOCUMENTS

| | | | | |
|---|---|---|---|---|
| 4,979,066 A | * | 12/1990 | Kawata et al. | 361/18 |
| 5,479,314 A | * | 12/1995 | Kares | 361/18 |
| 6,229,355 B1 | * | 5/2001 | Ogasawara | 327/108 |
| 6,313,690 B1 | * | 11/2001 | Ohshima | 327/427 |
| 6,356,138 B1 | * | 3/2002 | Ohshima | 327/434 |
| 6,582,119 B2 | * | 6/2003 | Mori et al. | 374/45 |
| 6,760,207 B2 | * | 7/2004 | Wyatt et al. | 361/93.1 |
| 7,443,229 B1 | * | 10/2008 | Vinciarelli et al. | 327/531 |
| 2002/0012216 A1 | * | 1/2002 | Ohshima | 361/93.1 |
| 2007/0103832 A1 | * | 5/2007 | Ohshima | 361/93.1 |

FOREIGN PATENT DOCUMENTS

| | | |
|---|---|---|
| JP | A-06-289087 | 10/1994 |
| JP | A-2000-253564 | 9/2000 |
| JP | A-2000-299624 | 10/2000 |
| JP | A-2001-217696 | 8/2001 |
| JP | A-2003-158447 | 5/2003 |

OTHER PUBLICATIONS

Office Action issued in Japanese Patent Application No. 2007-545762, on May 25, 2010 (with translation).

* cited by examiner

*Primary Examiner* — Rexford Barnie
*Assistant Examiner* — Christopher Clark
(74) *Attorney, Agent, or Firm* — Oliff & Berridge, PLC

(57) ABSTRACT

A comparator receives, on its second input terminal, a third anomaly threshold voltage from a threshold voltage generator, and outputs a low-level breaking indication signal to a control logic portion when a terminal voltage falls below the third anomaly threshold voltage. Three threshold setting resistors are serially connected between the source of a power MOSFET and a ground terminal. A divided voltage at the connecting point between the threshold setting resistors and is outputted as the third anomaly threshold voltage.

8 Claims, 9 Drawing Sheets

FIG.6

| FC COUNTER | FR COUNTER (higher 5 bits) | THRESHOLD DESIGNATION SIGNAL |
|---|---|---|
| [FCC]<8 | 0≤[FRC]<1 | OCL0 |
| | 1≤[FRC]<2 | OCL1 |
| | 2≤[FRC]<4 | OCL2 |
| | 4≤[FRC]<8 | OCL3 |
| | 8≤[FRC]<32 | OCL4 |
| | [FRC]≤32 | OCL5 |
| [FCC]≥8 | — | OCL5 |

POWER SUPPLY CONTROLLER

TECHNICAL FIELD

The present invention relates to a power supply controller, and particularly relates to detection of a wire-breaking anomaly.

BACKGROUND ART

A power supply controller is conventionally provided, in which a high-power semiconductor switching element such as a power MOSFET is disposed on a current supply line connected between a power source and a load, and which is configured to control the power supply to the load by switching the semiconductor switching element between ON and OFF. In such a power supply controller, it is known that a self-protective function is provided for protecting its own semiconductor switching element. The self-protective function turns off the semiconductor switching element by controlling the potential of the control terminal (e.g., the gate in the case of a MOSFET) of the semiconductor switching element, when an overcurrent (i.e., an abnormal current) has occurred on the current supply line due to short-circuiting in the load, for example. Specifically, as shown in JP-A-2001-217696, a current detecting resistor (shunt resistor) is serially connected to the load terminal (e.g., the source or drain in the case of a MOSFET) of the semiconductor switching element, and a load current passing through the semiconductor switching element is detected based on the interterminal voltage of the resistor. If the load current value is larger than a predetermined threshold, an occurrence of an overcurrent anomaly is determined, so as to turn off the semiconductor switching element resulting in a shutoff state.

In regard to this configuration breaking of wire could occur, for example, on a current supply line connected between the load terminal of the semiconductor switching element and the load. The wire-breaking anomaly should be detected in some cases. For example, in the case that the above power supply controller is used for controlling power supply for a vehicle lamp in order to provide Daytime lighting (or Daytime running light), it is difficult for a vehicle driver to find in the daytime that the vehicle lamp fails, due to breaking of wire, to normally turn on. In this case, the wire-breaking anomaly is particularly required to be detected. For example, when breaking of wire has occurred on the whole or a part of the above current supply line, the load resistance will increase. Therefore, if the load resistance exceeds a predetermined value, a wire-breaking anomaly can be determined based thereon. A construction for this determination can be, for example, a construction in which a wire-breaking anomaly is determined if a load current falls below a fixed threshold. However, according to this construction, a load resistance value, based on which a wire-breaking anomaly is determined, varies with variation of the power supply voltage. This presents a problem that detection of a wire-breaking anomaly may fail to provide an accurate detection result. In view of this, the power supply voltage and the load current are conventionally measured, and a wire-breaking anomaly is determined by processing the measurements using a microcomputer.

The present invention was made in view of the foregoing circumstances, and an object thereof is to provide a power supply controller capable of detecting a wire-breaking anomaly without using a microcomputer.

SUMMARY OF THE INVENTION

According to a first aspect of the invention, in a power supply controller for controlling power supply to a load by ON-OFF switching of a semiconductor switching element disposed on a current supply line connected between a power source and the load, a breaking anomaly signal is outputted if a load current passing through the semiconductor switching element is lower than a breaking anomaly threshold. The breaking anomaly threshold is changed according to the output-side voltage of the semiconductor switching element.

It should be noted that "the output-side voltage of the semiconductor switching element" of the present invention corresponds to the source voltage if a power MOSFET as an example of the semiconductor switching element is an N-channel type, and corresponds to the drain voltage if it is a P-channel type.

According to a second aspect of the invention, a power supply controller includes a semiconductor switching element disposed on a current supply line from a power source to a load, a current detecting element configured to detect a load current passing through the semiconductor switching element, and a breaking anomaly detecting circuit configured to output a breaking anomaly signal if it is determined based on a detection signal from the current detecting element that a load current passing through the semiconductor switching element is lower than a breaking anomaly threshold while the semiconductor switching element is in the ON state. Further included is a threshold adjustment circuit configured to change the breaking anomaly threshold according to the output-side voltage of the semiconductor switching element.

According to the present invention, a breaking anomaly signal is outputted if a load current passing through the semiconductor switching element is lower than the breaking anomaly threshold. Further, the breaking anomaly threshold is changed according to the output-side voltage of the semiconductor switching element. If the breaking anomaly threshold is supposedly set to a fixed value, a load resistance value, based on which a wire-breaking anomaly is determined, varies with variation of a power supply voltage, for example. In contrast, according to the present invention, the breaking anomaly threshold is changed according to the output-side voltage of the semiconductor switching element. Therefore, breaking of wire can be detected consistently based on the same load resistance value regardless of variation of the power supply voltage. Further, a microcomputer or the like is not required.

According to a third aspect of the invention, in a power supply controller as in the second aspect, the threshold adjustment circuit is provided as a voltage-dividing circuit configured to divide the output-side voltage of the semiconductor switching element. A load current corresponding to the divided voltage thereof is used as the breaking anomaly threshold.

According to the present invention, the circuit construction is simplified, because the threshold adjustment circuit can be formed solely using resistors. Further, in the case of a construction wherein a detecting resistor through which a current corresponding to a load current passes is provided so that a wire-breaking anomaly can be detected based on comparison of the terminal voltage of the detecting resistor with the divided voltage of the voltage-dividing circuit, the voltage-dividing circuit is preferably provided in a single chip or in a package while the detecting resistor is provided as an external element. According to this construction, the resistance values of the voltage-dividing resistors constituting the voltage-dividing circuit can vary in the same direction (i.e., in the increasing direction or decreasing direction of the resistance values) due to reasons of manufacturing of the chip and the like, and therefore the resistance ratio therebetween is not prone to variation. Consequently, an anomaly can be accurately detected with immunity from manufacturing variations, if an external element having an appropriate resistance value is selected as the detecting resistor, according to the abnormal current level to be detected, after completion of the chip and the like.

According to a fourth aspect of the invention, a power supply controller as in the second or third aspect further includes a switch control circuit configured to turn on the semiconductor switching element based on an input of an ON signal. The breaking anomaly detecting circuit includes a first filter circuit configured to suppress an output of the breaking anomaly signal until the elapsed time since an input of the ON signal reaches at least a first time.

When the ON signal is inputted for starting power supply, the load current may be initially lower than the breaking anomaly threshold even if a wire-breaking anomaly has not occurred. In view of this, according to the present invention, the output of a breaking anomaly signal is suppressed for at least a first time beginning with an input of the ON signal.

According to a fifth aspect of the invention, in a power supply controller as in any one of the second to fourth aspects, the breaking anomaly detecting circuit includes a determination circuit configured to output an indication signal according to the magnitude relation between the load current and the breaking anomaly threshold, and further includes a second filter circuit configured to output the breaking anomaly signal if the determination circuit outputs an anomaly indication signal, indicating that the load current is lower than the breaking anomaly threshold, continuously for at least a second time.

According to a sixth aspect of the invention, in a power supply controller as in the fifth aspect, the second filter circuit outputs a normal signal when the determination circuit outputs a normal indication signal indicating that the load current is equal to or higher than the breaking anomaly threshold.

According to a seventh aspect of the invention, in a power supply controller as in the sixth aspect, the second filter circuit includes a timer circuit configured to repeatedly measure the second time, and output a clear signal at the end of each measurement of the second time. The second filter circuit further includes a counter circuit configured to count the number of outputs of the clear signal from the timer circuit while the determination circuit is outputting the anomaly indication signal. The counter circuit outputs the breaking anomaly signal, if the counted number reaches a plural number. The counted number is reset when the determination circuit outputs the normal indication signal.

According to the invention described above, the breaking anomaly signal is outputted if the load current remains lower than the breaking anomaly threshold continuously for at least the second time. Thereby, the effect of noise or the like can be suppressed, resulting in accurate detection of a wire-breaking anomaly. Preferably, a normal signal is outputted (i.e., the breaking anomaly signal is discontinued) when the load current becomes equal to or higher than the breaking anomaly threshold, as in the sixth aspect. Further, the construction as in the seventh aspect is preferable as a specific structure therefor.

EFFECT OF THE INVENTION

The breaking anomaly threshold is changed according to the output-side voltage of the semiconductor switching element, and thereby breaking of wire can be detected consistently based on the same load resistance value regardless of variation of the power supply voltage. Further, a microcomputer or the like is not required.

BRIEF DESCRIPTION OF THE DRAWINGS

FIG. 6 is a table showing a correspondence relation between count values, of a fuse counter and an FR counter, and a threshold designation signal;

EXPLANATION OF SYMBOLS

Figure 1:
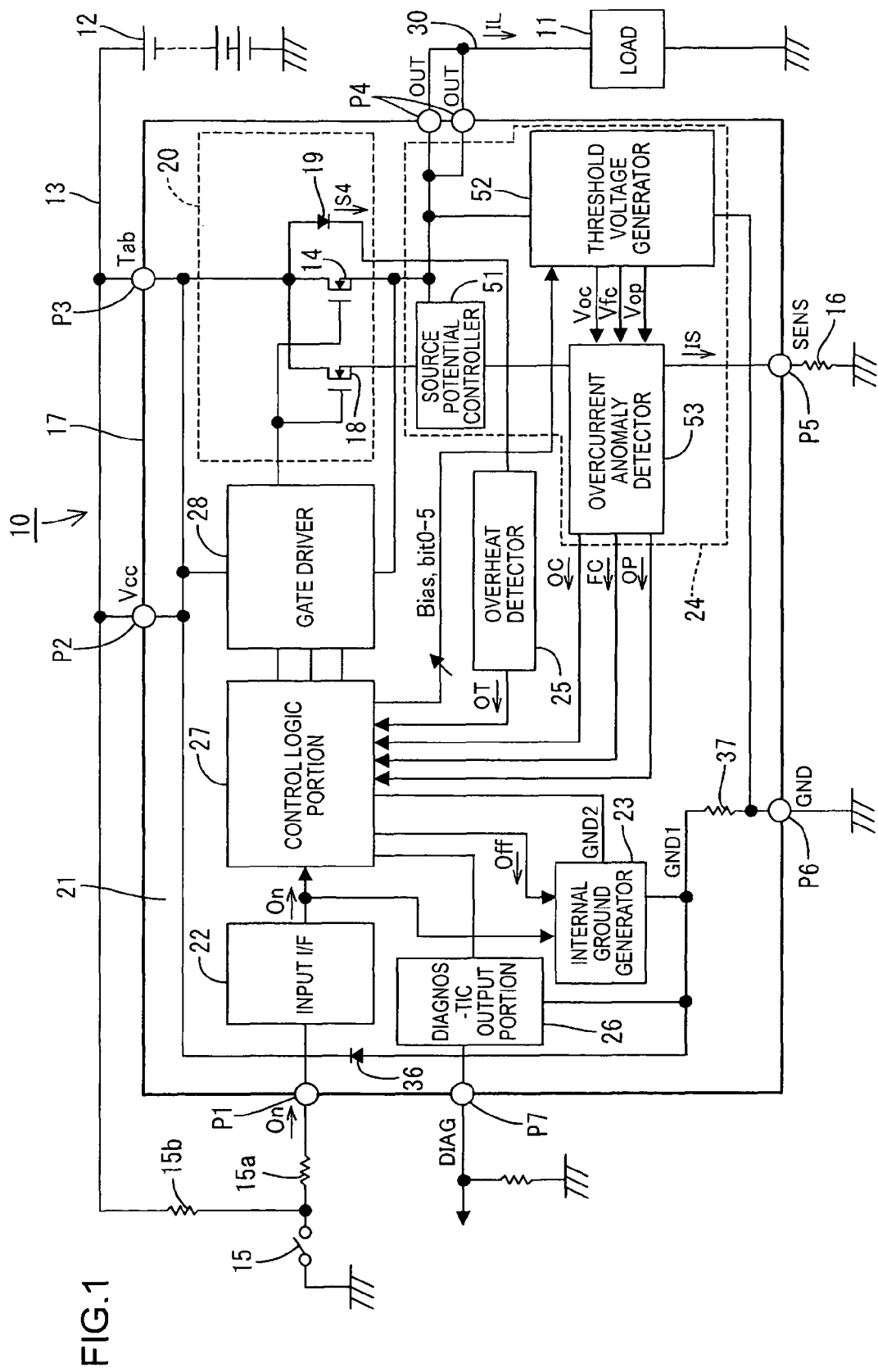
FIG. 1 is a block diagram showing the general construction of a power supply controller according to an embodiment of the present invention.

10 . . . Power supply controller
11 . . . Load
12 . . . Power source
13 . . . Current supply line
14 . . . Power MOSFET (Semiconductor switching element)
18 . . . Sense MOSFET (Current detecting element)
28 . . . Gate driver (Switch control circuit)
52 . . . Threshold voltage generator (Threshold adjustment circuit)
54 . . . Comparator (Determination circuit)
59 . . . Comparator (Abnormal current detecting circuit)
64a-64c . . . Threshold setting resistor (Voltage-dividing circuit)
72 . . . Clear counter (Timer circuit, Normal duration accumulator circuit)
73 . . . Fuse counter (Anomaly time accumulator circuit)
100, 101 . . . Memory circuit (Counter circuit)
CLR . . . Low-level clear signal (Clear signal)
FC . . . Low-level fuse current signal (Current anomaly signal)
IL . . . Load current
ILfc . . . Second anomaly threshold current (Current anomaly threshold)
ILop . . . Third anomaly threshold current (Breaking anomaly threshold)
Is . . . Sense current (Detection signal)
OP . . . Low-level breaking indication signal (Anomaly indication signal)
OP . . . High-level breaking indication signal (Normal indication signal)
OPF . . . Low-level breaking anomaly signal (Breaking anomaly signal)
OPF . . . High-level breaking anomaly signal (Normal signal)
On . . . Low-level control signal (ON signal)
Vop . . . Third anomaly threshold voltage (Divided voltage)
Vs . . . Source voltage (Output-side voltage)

BEST MODE FOR CARRYING OUT THE INVENTION

An embodiment according to the present invention will be explained with reference to FIGS. 1 through 9. In the drawings, an overbar attached to a symbol indicating each of various signals represents that the signal is a low active signal.

1. Construction of Power Supply Controller

FIG. 1 is a block diagram showing the general construction of a power supply controller 10 according to the present embodiment. The power supply controller 10 can be installed on a vehicle not shown, and used for control of power supply from a vehicle power source (hereinafter, referred to as "a power source 12") to a load 11. The load 11 may be a defogger heater (as a linear resistive load), a vehicle lamp, or a motor (as an L-load (or inductive load)) for a cooling fan or a wiper, for example. Hereinafter, "a load" means a device to be controlled by the power supply controller 10, and does not include an electric wire 30 connected between the power supply controller 10 and the controlled device. The load 11 and the electric wire 30 are collectively called "an external circuit".

Specifically, the power supply controller 10 includes a power MOSFET 14 (i.e., an example of "a semiconductor switching element") as a power FET disposed on a current supply line 13 connected between the power source 12 and the load 11. In the power supply controller 10, a control signal On such as a constant voltage signal or a PWM (Pulse Width Modulation) control signal is applied to the gate of the power MOSFET 14 so as to achieve ON-OFF switching. Thereby, power supply to the load 11 connected to the output side of the power MOSFET 14 is controlled. In the present embodiment, an input terminal P1 of the power supply controller 10 is connected to an external operation switch 15, and the power supply controller operates when the operation switch 15 is ON. Specifically, the input terminal P1 is connected to the operation switch 15 via a resistor 15a, and the connecting point between the operation switch 15 and the resistor 15a is connected to the power source 12 via a resistor 15b. Thus, the input terminal P1 is pulled up to the power supply voltage Vcc side when the operation switch 15 is OFF.

As shown in FIG. 1, the power supply controller 10 is formed as a semiconductor device 17 (semiconducting device), on which the input terminal P1, a power supply (Vcc) terminal P2 and a tab terminal P3 to be connected to the power source 12, a load connecting terminal P4 to be connected to the load 11, an external terminal P5 to be connected to the ground (GND) via an external resistor 16 as a current-voltage converter circuit, a ground terminal P6 to be connected directly to the ground (GND), and a diagnostic output terminal P7 are provided. In the present embodiment, the power MOSFET 14, a sense MOSFET 18 (i.e., an example of "a current detecting element") as a sense FET described below and a temperature sensor 19 (e.g., a diode in the present embodiment) as a temperature detecting element are configured onto a single chip as a power chip 20, which is mounted on a control chip 21.

Figure 3:
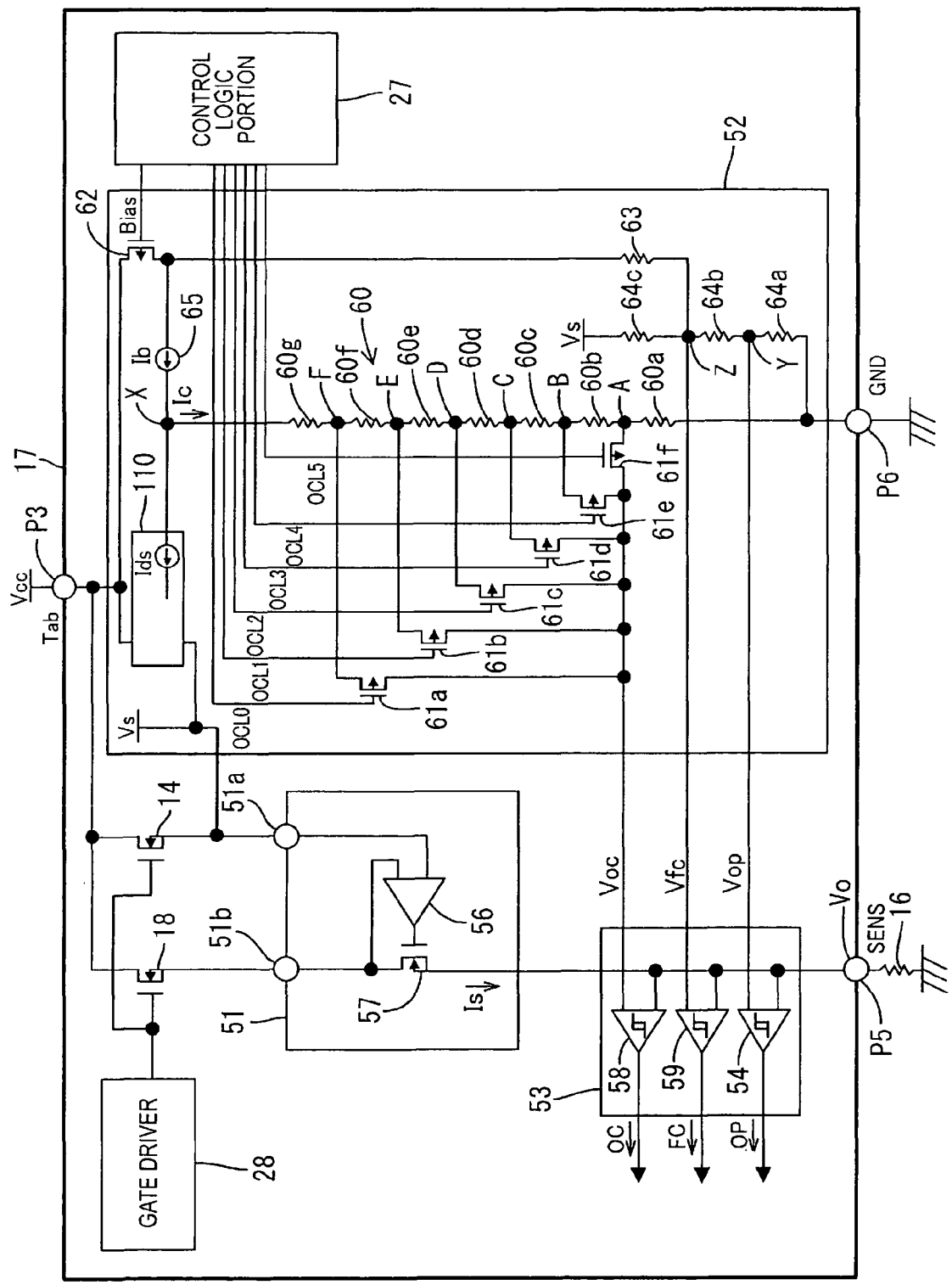
FIG. 3 is a circuit diagram of a source potential controller, a threshold voltage generator and a current anomaly detector.

A plurality of N-channel MOSFETs are arranged on the power chip 20. The drains of the MOSFETs are connected in common to one another, and further connected to the tab terminal P3. The sources of most of the MOSFETs are connected in common to a power FET input 51a of a source potential controller 51 described below and the load connecting terminal P4, so that the MOSFETs form the power MOSFET 14 as shown in FIG. 3. The sources of the rest of the MOSFETs are connected in common to a sense FET input 51b of the source potential controller 51, so that the MOSFETs form the sense MOSFET 18. The ratio of the number of MOSFETs constituting the sense MOSFET 18 to the number of MOSFETs constituting the power MOSFET 14 corresponds approximately to a sense ratio k.

The control chip 21 mainly includes an input interface 22, an internal ground generator 23, a current detector 24, an overheat detector 25, a diagnostic output portion 26, a control logic portion 27 and a gate driver 28. A diode 36, the cathode side of which is connected to the higher potential side, and a resistor 37 are serially connected between the power supply terminal P2 and the ground terminal P6 as shown in FIG. 1. The connecting point therebetween is provided as an internal ground GND1. According to this construction, if the ground terminal P6 side is connected to the power supply voltage Vcc side by mistake, a current passing into the circuits of the power supply controller 10 is suppressed because of the diode 36 so as to be equal to or lower than a predetermined level.

(Input Interface)

The input side of the input interface 22 is connected to the input terminal P1. Thereby, a control signal On of high level is inputted when the operation switch 15 is OFF, while a control signal On of low level (low active) is inputted when the operation switch is ON. The control signal On is then applied to the internal ground generator 23 and the control logic portion 27. In a normal state, i.e., when neither a current anomaly nor a temperature anomaly has occurred as will be described below, the power supply controller 10 turns ON the power MOSFET 14 (resulting in a conductive state), by the gate driver 28 in response to an active (low-level) control signal On described above. On the other hand, in response to a nonactive (high-level) control signal On, the power supply controller turns OFF the power MOSFET 14, resulting in a shutoff state, by the gate driver 28. In the present embodiment, a low-level control signal On corresponds to an ON signal (a load ON signal), while a nonactive control signal On corresponds to an OFF signal. The gate driver 28 functions as "a switch control circuit".

(Internal Ground Generator)

The internal ground generator 23 as an internal power circuit operates when it receives an active control signal On (ON signal) from the input interface 22 or a low-level output signal Off (indicating that a clear counter 72 has not overflowed) from the control logic portion 27 described below, so as to generate an internal ground GND2 lower than the power supply voltage Vcc by a predetermined constant voltage Vb. That is, the internal ground generator 23 is maintained to the operational state so as to continue generation of the internal ground GND2 as long as a low-level output signal Off is received from the control logic portion 27 (or unless and until the clear counter 72 overflows), even if a nonactive control signal On (OFF signal) is received from the input interface 22 after turn-on. Thus, the constant voltage Vb, corresponding to the difference determined by subtracting the internal ground GND2 from the power supply voltage Vcc, is provided for the control logic portion 27, and thereby the control logic portion 27 can operate.

Figure 2:
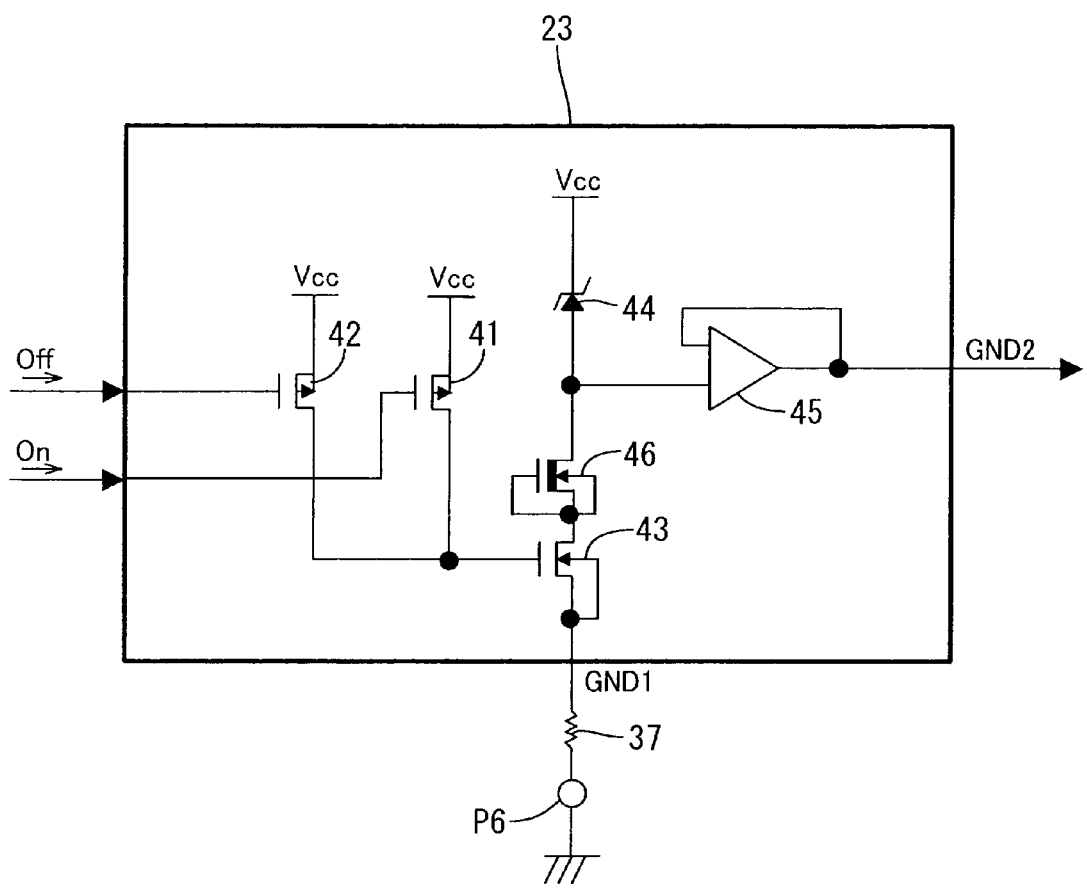
FIG. 2 is a circuit diagram of an internal ground generator.

Specifically, as shown in FIG. 2, the internal ground generator 23 includes an FET 41 as a switching element to be turned on in response to an active control signal On, and an FET 42 as a switching element to be turned on in response to a low-level output signal Off. The output sides of the FETs 41, 42 are both connected to the control terminal of an FET 43 as a switching element. The input side (i.e., the drain side) of the FET 43 is connected to the power supply terminal P2 via a Zener Diode 44, while the output side (i.e., the source side) thereof is connected to the ground terminal P6 via the resistor 37.

In the internal ground generator 23, the FET 43 is turned on in response to an active control signal On or a low-level output signal Off. Thereby, the internal ground generator operates so as to generate the internal ground GND2, which is lower than the power supply voltage Vcc by a voltage corresponding to the Zener voltage of the Zener diode 44. The generated internal ground is provided for the control logic portion 27, via an operational amplifier 45 as a voltage follower. In the present embodiment, an FET 46, in which short connection between the source and gate (i.e., diode connection) is formed, is disposed on a current supply line connected between the Zener diode 44 and the FET 43. Thereby, a constant current passes through the Zener diode 44 when the FET 43 is on, and consequently a more stable internal ground GND2 can be generated.

(Current Detector)

The current detector 24 includes a source potential controller 51, a threshold voltage generator 52, and a current anomaly detector 53 as shown in FIG. 1. FIG. 3 is a circuit diagram mainly showing the source potential controller 51, the threshold voltage generator 52 and the current anomaly detector 53, and the rest of the circuit construction is partly omitted.

a. Source Potential Controller

The source potential controller 51 is provided for maintaining the output-side potentials (i.e., the source potentials) of the power MOSFET 14 and the sense MOSFET 18 to be equal to each other.

The source potential controller 51 includes an operational amplifier 56 and an FET 57 as a switching element. The pair of input terminals of the operational amplifier 56 are connected to the power FET input 51a (i.e., to the source of the power MOSFET 14) and the sense FET input 51b (i.e., to the source of the sense MOSFET 18), respectively. The FET 57 is connected between the sense FET input 51b and the external terminal P5, and the output of the operational amplifier 56 is applied to the control terminal thereof. More specifically, the negative input of the operational amplifier 56 is connected to the power FET input 51a, while the positive input of the operational amplifier 56 is connected to the sense FET input 51b. The differential output of the operational amplifier 56 is fed back to the positive input through between the gate and drain of the FET 57.

The operational amplifier 56 is maintained in an imaginary short state due to the feedback of the differential output of the operational amplifier 56, that is, the potentials of the positive input and negative input are maintained almost equal to each other. Thereby, the potential of the drains of the power MOSFET 14 and the sense MOSFET 18 are maintained equal to each other, and the potential of the sources thereof are also maintained equal to each other. Consequently, a sense current Is (i.e., an example of "a detection signal from a current detecting element") passing through the sense MOSFET 18 can be stably maintained to a constant ratio (i.e., the sense ratio k) to a load current IL passing through the power MOSFET 14. The sense current Is from the source potential controller 51 passes into the external resistor 16 via the external terminal P5, and therefore the terminal voltage Vo of the external terminal P5 varies with the sense current Is.

b. Current Anomaly Detector

The current anomaly detector 53 includes one comparator or a plurality (e.g., three in the present embodiment) of comparators 54, 58, 59 (e.g., hysteresis comparators in the present embodiment). The terminal voltage Vo of the external terminal P5 is applied to one input of each comparator 54, 58, 59.

The comparator 58 receives a first anomaly threshold voltage Voc on the other input thereof from the threshold voltage generator 52, and outputs an overcurrent signal OC of low level (low active) to the control logic portion 27 when the terminal voltage Vo exceeds the first anomaly threshold voltage Voc. Hereinafter, a load current IL, passing through the power MOSFET 14 when the terminal voltage Vo reaches the first anomaly threshold voltage Voc (i.e., during a current anomaly), is called "a first anomaly threshold current ILoc", and this current anomaly is called "an overcurrent".

The comparator 59 (i.e., an example of "an abnormal current detecting circuit") receives a second anomaly threshold voltage Vfc (<Voc) on the other input thereof from the threshold voltage generator 52, and outputs a fuse current signal FC of low level (i.e., a low active signal, and an example of "a current anomaly signal") to the control logic portion 27 when the terminal voltage Vo exceeds the second anomaly threshold voltage Vfc. Hereinafter, a load current IL, passing through the power MOSFET 14 when the terminal voltage Vo reaches the second anomaly threshold voltage Vfc, i.e., during a current anomaly, is called "a second anomaly threshold current ILfc" (i.e., an example of "a current anomaly threshold"), and this current anomaly is called "a fuse current".

The comparator 54 (i.e., an example of "a determination circuit" and "a breaking anomaly detecting circuit") receives a third anomaly threshold voltage Vop on the other input thereof from the threshold voltage generator 52, and outputs a breaking indication signal OP of low level (i.e., a low active signal, and an example of "an anomaly indication signal") to the control logic portion 27 when the terminal voltage Vo is lower than the third anomaly threshold voltage Vop. Hereinafter, a load current IL, passing through the power MOSFET 14 when the terminal voltage Vo reaches the third anomaly threshold voltage Vop, is called "a third anomaly threshold current ILop" (i.e., an example of "a breaking anomaly threshold"), and this anomaly is called "a wire-breaking anomaly".

c. Threshold Voltage Generator

As shown in FIG. 3, the threshold voltage generator 52 (i.e., an example of "a threshold adjustment circuit") mainly includes a current output circuit 110, which outputs a current Ic indicating the difference determined by subtracting a current Ids (<Ib) corresponding to the drain-to-source voltage Vds of the power MOSFET 14 (i.e., an input-to-output voltage of a semiconductor switching element) from a current Ib corresponding to a predetermined constant voltage, and further includes a threshold setting resistor 60, through which the output current Ic from the current output circuit 110 passes.

Specifically, the current output circuit 110 is connected between the drain and source of the power MOSFET 14, and thereby causes a current Ids corresponding to the drain-to-source voltage Vds thereof to pass into the ground terminal P6. Further, an FET 62, which turns on in response to a bias signal Bias as described below, and a constant current circuit 65, which causes the current Ib, are connected between the input terminal, provided on the current output circuit 110 for receiving the current Ids, and the power supply terminal P2. A plurality of threshold setting resistors (e.g., seven threshold setting resistors 60a-60g in the present embodiment) are serially connected between the connecting point X, between the above input terminal and the constant current circuit 65, and the ground terminal P6, so that the above third current Ic passes through the threshold setting resistors 60a-60g. Divided voltages at the respective connecting points A-F between the threshold setting resistors 60a-60g vary in proportion to the third current Ic (=Ib−Ids), i.e., in proportion to a voltage corresponding to the difference determined by subtracting the drain-to-source voltage Vds of the power MOSFET 14 from the constant voltage. According to this construction, the first anomaly threshold current ILoc decreases with increase of the drain-to-source voltage Vds of the power MOSFET 14, and increases with decrease.

Therefore, if short-circuiting in the load 11 occurs immediately after turn-on of the power MOSFET 14, the first anomaly threshold current ILoc is then set to a relatively low level because the drain-to-source voltage Vds is relatively high. Consequently, the load current IL can reach the first anomaly threshold current ILoc early without reaching a high level, i.e., when it is relatively low level, and thereby the current detector 24 can output an active signal OC early. Further, in case that the power supply voltage Vcc decreases, for example, the first anomaly threshold current ILoc is maintained substantially equal to the level before the decrease of the power supply voltage Vcc. This is because, even if the power supply voltage Vcc decreases, the drain-to-source voltage Vds is almost maintained as long as the power MOSFET 14 is ON. Therefore, the power supply operation of the power MOSFET 14 can be sufficiently achieved in this case.

The threshold voltage generator 52 further includes a plurality of FETS 61a-61f as switching elements for connecting the other input terminal of the comparator 58 selectively to the connecting points A-F between the threshold setting resistors 60a-60g. Thereby, the first anomaly threshold voltage Voc can be decreased stepwise by turning on the FETs 61a-61f selectively and sequentially. The ON-OFF switching of the FETs 61a-61f is controlled by the control logic portion 27 as described below.

On the other hand, the second and third anomaly threshold voltages Vfc and Vop vary with the source voltage Vs of the power MOSFET 14 (i.e., an example of "an output-side voltage of a semiconductor switching element"). Specifically, a plurality of voltage-dividing resistors (e.g., three threshold setting resistors 64a-64c in the present embodiment) are serially connected between the source of the power MOSFET 14 and the ground terminal P6. The divided voltage at the connecting point Y between the threshold setting resistors 64a and 64b is outputted as the third anomaly threshold voltage Vop, while the divided voltage at the connecting point Z between the threshold setting resistors 64b and 64c is outputted as the second anomaly threshold voltage Vfc.

Therefore, in case that a fuse current occurs immediately after turn-on of the power MOSFET 14, the second anomaly threshold current ILfc is then set to a relatively low level because the drain-to-source voltage Vds is relatively high. Consequently, the load current IL can reach the second anomaly threshold current ILfc early without reaching a high level (i.e., when it is relatively low level), and thereby the current detector 24 can output an active signal FC early.

Figure 5:
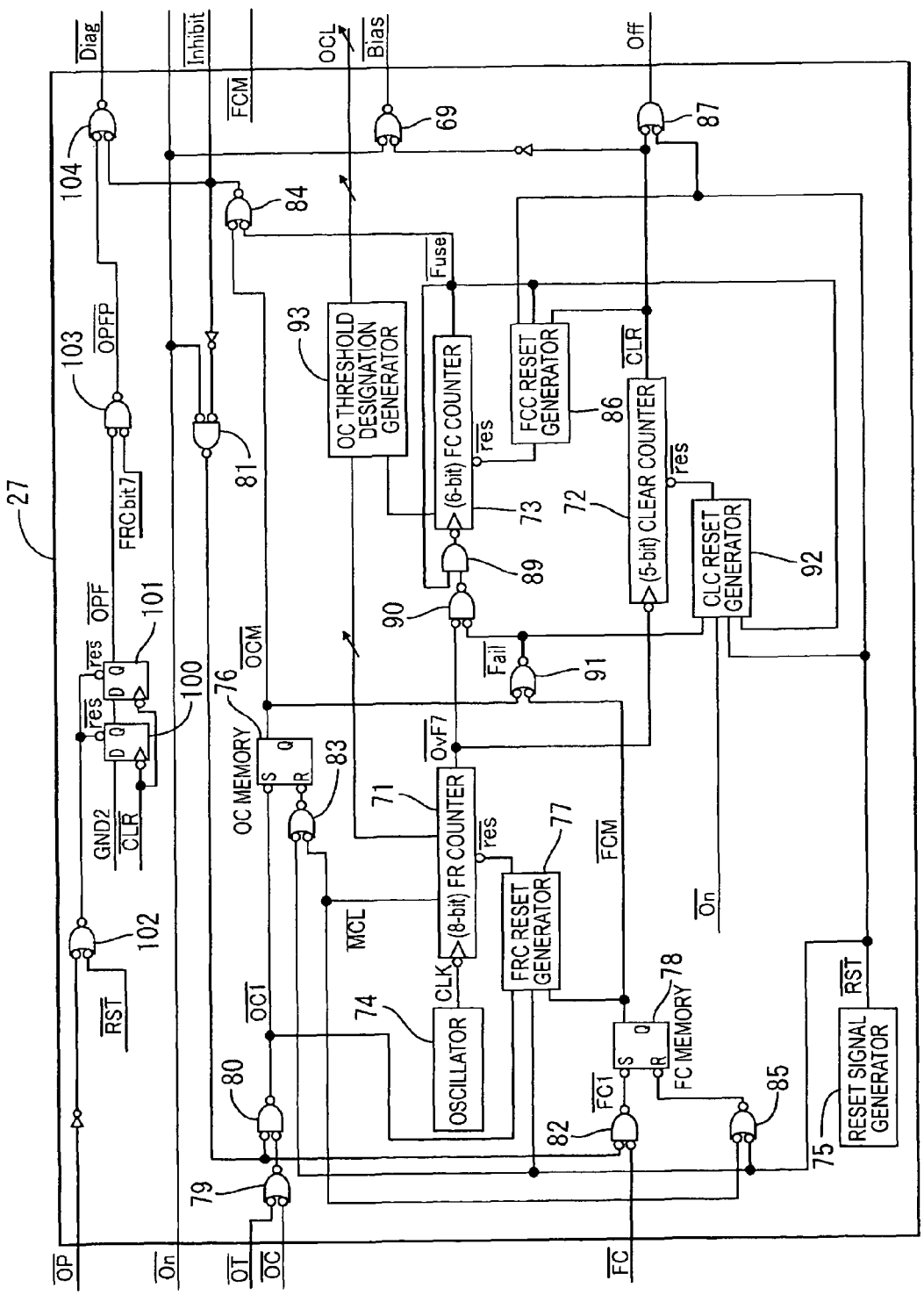
FIG. 5 is a circuit diagram of a control logic portion.

In the present embodiment, the FET 62, which is a switching element that turns on in response to a low-level bias signal Bias from the control logic portion 27, and a resistor 63 are provided between the power supply terminal P2 and the connecting point Z, and thereby the second and third anomaly threshold currents ILfc and ILop are biased so as not to decrease to a negative level with variation of the load resistance of the load 11. When the FET 62 turns on, a current passes through the resistor 63 and thereby the second and third anomaly threshold voltages Vfc and Vop are pulled up to the power supply voltage Vcc side by a voltage corresponding to a voltage drop on the resistor 63. The low-level bias signal Bias is outputted from the control logic portion 27 for turning on the FET 62, when the control signal On is active or the clear signal CLR is active. Specifically, as described below, a NOR circuit 69, to which a level-inverted signal of the control signal On and a clear signal CLR from the clear counter 72 are inputted, is provided in the control logic portion 27 as shown in FIG. 5, and the NOR circuit 69 can output a low-level (low active) bias signal Bias. On the other hand, the first anomaly threshold current ILoc can be biased by designing so that 'Ib−Ids>0' is satisfied. Thus, the second current Ib can function as a bias.

Figure 4:
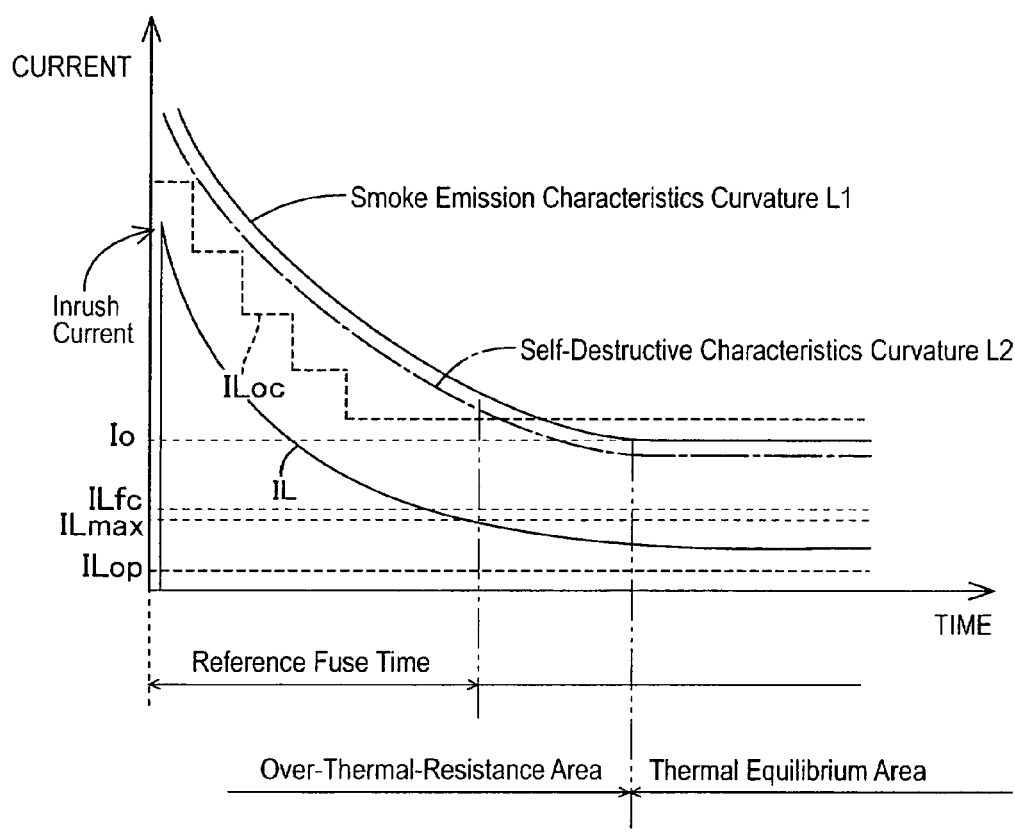
FIG. 4 is a graph for explanation of setup levels of a first anomaly threshold current and a second anomaly threshold current.

FIG. 4 is a graph for explanation of setup levels of the first, second and third anomaly threshold currents ILoc, ILfc, and ILop. The graph relates to the smoke emission characteristics of an electric wire 30 (e.g., a coating material of the electric wire) connectable to the power supply controller 10, in which the smoke emission characteristics curvature L1 representing the relation between a constant current level and a current-applying time (i.e., a time taken for fusing) is shown. That is, the smoke emission characteristics curvature L1 represents the relation between an arbitrary constant current (one-shot current) and a time taken for the coating material of the electric wire 30 to begin to burn while the constant current is applied to the electric wire 30. In the graph, a self-destructive characteristics curvature L2 is also shown, which represents the relation between an arbitrary constant current (one-shot current) and a time taken for the power MOSFET 14 to break while the constant current is applied to the MOSFET 14. The second anomaly threshold current ILfc is set to a value within the area where a current level is lower than the smoke emission characteristics curvature L1 and the self-destructive characteristics curvature L2. The first anomaly threshold current ILoc is set to a value within the area where a current level is lower than the smoke emission characteristics curvature L1 and the self-destructive characteristics curvature L2, for a time domain corresponding to a reference FUSE time described below beginning with start of count from the initial value by a fuse counter 73.

Note that the smoke emission characteristics shown in the graph relates to an electric wire 30 selected from electric wires 30 likely connected to the power supply controller 10. The smoke emission characteristics depends on an external circuit (e.g., a wiring member such as an electric wire, or a load) to be connected to the power supply controller 10. Therefore, values of the load current IL and the sense current Is, based on which active signals FC, OC are outputted, should be also changed depending thereon. However, that can be readily achieved by adjusting the resistance of the above-described external resistor 16.

In the graph, ILmax represents the rated current of the load 11 (i.e., a current value corresponding to a limit of use of the device against which the design thereof is guaranteed). Io represents the equilibrium critical current that can be applied while maintaining a thermal equilibrium state in which heat generation and radiation in the electric wire 30 are balanced. If a current of a higher level than the equilibrium critical current Io is applied, that relates to the over-thermal-resistance area in which a current level and a time taken for burn are substantially in inverse proportion to each other. The second anomaly threshold current ILfc is set to a value slightly higher than the rated current ILmax of the load 11 as shown in FIG. 4. The comparator 59 detects a fuse current when the load current IL reaches the second anomaly threshold current ILfc, and outputs an active fuse current signal FC. If the load current IL is around the second anomaly threshold current ILfc, the power MOSFET 14 does not need to be turned OFF immediately. It should be turned OFF, only if the fuse current state continues for a considerable time as described below.

The third anomaly threshold current ILop is set to a further lower level than the rated current ILmax. The comparator 54 detects a wire-breaking anomaly when the load current IL reaches the third anomaly threshold current ILop, and outputs an active breaking indication signal OP.

In contrast, the first anomaly threshold current ILoc is set to a level higher than the second anomaly threshold current ILfc. The comparator 58 detects an overcurrent when the load current IL reaches the first anomaly threshold current ILoc, and outputs a low-level overcurrent signal OC. When the load current IL is thus high level beyond the first anomaly threshold current ILoc, the power MOSFET 14 should be turned OFF immediately as described below. In preparation for an inrush current, the threshold voltage generator 52 first sets the first anomaly threshold current ILoc to an initial level higher than the inrush current as shown in FIG. 4. Thereafter, if a fuse current is detected, for example, the first anomaly threshold current ILoc is decreased stepwise with time as described below.

(Overheat Detector)

The overheat detector 25 receives a temperature signal S4 corresponding to a temperature of the power chip 20 from the temperature sensor 19 provided on the power chip 20. The overheat detector 25 detects a temperature anomaly when the received temperature signal S4 exceeds a predetermined threshold temperature, and provides a low-level (low active) temperature anomaly signal OT to the control logic portion 27.

(Control Logic Portion)

FIG. 5 is a circuit diagram of the control logic portion 27. The control logic portion 27 mainly includes an FR counter (free-running counter) 71, the clear counter 72, the fuse counter (FC counter) 73, an oscillator 74, a reset signal generator 75 and the like. The control logic portion 27 receives the control signal On from the input interface 22, the signals OC, FC, OP from the current detector 24, and the temperature anomaly signal OT from the overheat detector 25 as described above.

a. Oscillator and Reset Signal Generator

The oscillator 74 generates and outputs a clock signal CLK (in 125 microsecond period, for example). The reset signal generator 75 generates a constant voltage sufficient for the internal ground generator 23 and the present control logic portion 27 to operate. Further, it outputs a reset signal RST of low level (low active), unless and until clock generation of the oscillator 74 is stabilized. After the clock generation is stabilized, a reset signal RST of high level is outputted.

b. Overcurrent Protective Circuit

If at least one of an active overcurrent signal OC from the current detector 24 and an active temperature anomaly signal OT from the overheat detector 25 is received, the overcurrent protective circuit mainly performs a forcing shutoff operation of the power MOSFET 14 for a predetermined reference OFF duration, and thereafter releases the forcing shutoff state. Specifically, the overcurrent protective circuit includes the FR counter 71, an OC memory 76, an FRC reset generator 77, an FC memory 78 and the like. In the present embodiment, "forcing shutoff" means that the power MOSFET 14 is forcibly turned OFF although the power supply controller 10 is receiving an active control signal On (ON signal).

The control logic portion 27 includes a NOR circuit 79, which receives the level-inverted signals of the signals OC, OT, and further includes a NAND circuit 80, which receives the level-inverted signal of an output signal from the NOR circuit 79. The level-inverted signal of a set signal OC1 from the NAND circuit 80 is inputted to the set terminal of the OC memory 76 (i.e., an RS flip-flop). The level-inverted signal of an output signal of a NAND circuit 81 is also inputted to the NAND circuit 80. The level-inverted signal of a control signal On and a forcing shutoff signal Inhibit (which is low level when forcing shutoff of the power MOSFET 14 should be performed) described below are inputted to the NAND circuit 81.

According to this construction, while an active control signal On is inputted, the NAND circuit 80 outputs a set signal OC1 of low level (low active), if at least one of an active overcurrent signal OC from the current detector 24 and an active temperature anomaly signal OT from the overheat detector 25 is inputted to the control logic portion 27 and the forcing shutoff signal Inhibit is high level. That is, while an ON signal is inputted, the NAND circuit 80 outputs an active set signal OC1 so that the OC memory 76 is turned to the set state, if an overcurrent or a temperature anomaly is detected and the power MOSFET 14 is not in the forcing shutoff state.

The control logic portion 27 further includes a NAND circuit 82, to which the level-inverted signal of an output signal of the NAND circuit 81 and the level-inverted signal of a fuse current signal FC are inputted. The level-inverted signal of a (low active) set signal FC1 from the NAND circuit 82 is inputted to the set terminal of the FC memory 78 (i.e., an RS flip-flop). According to this construction, while a low-level control signal On is inputted, the NAND circuit 82 outputs a set signal FC1 of low level (low active) if an active fuse current signal FC from the current detector 24 is inputted to the control logic portion 27 and the forcing shutoff signal Inhibit is high level. That is, while an ON signal is inputted, the NAND circuit 82 outputs an active set signal FC1 so that the FC memory 78 is turned to the set state, if a fuse current is detected and the power MOSFET 14 is not in the forcing shutoff state.

The FR counter 71 normally counts a predetermined time repeatedly, and is reset to "1" (i.e., the least significant bit is set to "1" and the other bits are set to "0") when any of the following reset conditions 1-3 is satisfied. In the present embodiment, the FR counter 71 is an 8-bit free-running counter, for example, and increments its count value one by one at times corresponding to down edges of the clock signal CLK from the oscillator 74 (i.e., in 125 microsecond periods). The FR counter overflows every 32 milliseconds, unless it is reset.

Reset Condition 1: The reset signal generator 75 outputs an active reset signal RST;

Reset Condition 2: The NAND circuit 80 outputs an active set signal OC1 (i.e., an overcurrent or a temperature anomaly is detected, and the power MOSFET 14 is not in the forcing shutoff state); and Reset Condition 3: The output signal FCM of the FC memory 78 is turned from high level to low level (i.e., the FRC reset generator 77 detects a down edge of the output signal FCM).

When any of the above reset conditions is satisfied, the FRC reset generator 77 outputs a reset signal res of low level (low active) so that the FR counter 71 is temporarily turned to the reset state. The FR counter 71 outputs a count signal OvF7 of low level (low active), when the seven lower bits of the counter overflow (i.e., all the bits are "1"). Further, it outputs a shutoff release signal MCL of low level (low active), when all the seven lower bits of the counter are "0". That is, the FR counter 71 outputs an active count signal OvF7 at a predetermined time interval (e.g., at a 16-millisecond interval), unless it is reset. Further, it outputs an active shutoff release signal MCL at the above predetermined time interval, or more specifically, a predetermined time (one count in the present embodiment) later than the output of a count signal OvF7.

The level-inverted signal of an output signal from a NOR circuit 83 is inputted to the reset terminal of the OC memory 76. The level-inverted signal of a reset signal RST from the reset signal generator 75 and the level-inverted signal of a shutoff release signal MCL from the FR counter 71 are inputted to the NOR circuit 83. According to this construction, the OC memory 76 turns to the set state in response to an active set signal OC1 as described above, so as to output a first forcing shutoff signal OCM of low level (low active). It outputs a first forcing shutoff signal OCM of high level, when the reset signal RST or the shutoff release signal MCL is active.

A NOR circuit 84 receives the level-inverted signal of a first forcing shutoff signal OCM and the level-inverted signal of a second forcing shutoff signal Fuse from the fuse counter 73 described below, and it outputs a forcing shutoff signal Inhibit of low level (low active) when the first forcing shutoff signal OCM or the second forcing shutoff signal Fuse is active.

According to this construction, the overcurrent protective circuit outputs an active first forcing shutoff signal OCM from the OC memory 76 when the overcurrent signal OC or the temperature anomaly signal OT is active, so that forcing shutoff of the power MOSFET 14 is performed immediately. At the same time, the FR counter 71 is reset to restart the count, and thereafter (i.e., 16 milliseconds later), it outputs an active shutoff release signal MCL so that the OC memory 76 outputs a high-level first forcing shutoff signal OCM and thereby the forcing shutoff (first forcing shutoff) state of the power MOSFET 14 is released. The power MOSFET 14 can be thus restored to the conductive state as long as the power supply controller 10 receives an active control signal On. Such forcing shutoff, which is immediately performed for the power MOSFET 14 by the overcurrent protective circuit and the conductive state is restored a predetermined reference OFF duration later, is hereinafter referred to as "first forcing shutoff".

The level-inverted signal of an output signal from a NOR circuit 85 is inputted to the reset terminal of the FC memory 78. The level-inverted signal of a reset signal RST from the reset signal generator 75 and the level-inverted signal of a shutoff release signal MCL from the FR counter 71 are inputted to the NOR circuit 85. According to this construction, the FC memory 78 turns to the set state in response to an active set signal FC1 as described above, so as to output an output signal FCM of low level (low active) Further, it outputs an output signal FCM of high level, when the reset signal RST or the shutoff release signal MCL is active. The FC memory 78 continues to output an active output signal FCM as long as the set signal FC1 is active, even if the reset signal RST is active.

c. Fuse Anomaly Protective Circuit

A fuse anomaly protective circuit mainly accumulates an anomaly time (hereinafter, referred to as "a FUSE time") during which an active fuse current signal FC is received from the current detector 24 or first forcing shutoff of the power MOSFET 14 is performed by the overcurrent protective circuit. The fuse anomaly protective circuit causes a forcing shutoff operation for the power MOSFET 14, if the accumulated time reaches a predetermined reference FUSE time (longer than the above reference OFF duration). Hereinafter, such forcing shutoff caused by the fuse anomaly protective circuit is referred to as "second forcing shutoff". Specifically, the fuse anomaly protective circuit includes the fuse counter 73, an FCC reset generator 86 and the like.

The fuse counter 73 is a 6-bit counter, for example, and increments its count value one by one at times corresponding to down edges of the count signal OvF7 from the FR counter 71, for example. Unless the fuse counter is reset, it overflows when 1024 milliseconds are reached, and outputs a second forcing shutoff signal Fuse of low level (low active). More specifically, the level-inverted signal of an output signal of an AND circuit 89 is inputted to the clock input terminal of the fuse counter 73. The second forcing shutoff signal Fuse from the fuse counter 73 and an output signal from a NAND circuit 90 are inputted to the AND circuit 89. The level-inverted signal of a count signal OvF7 from the FR counter 71 and the level-inverted signal of an anomaly notification signal Fail from a NOR circuit 91 are inputted to the NAND circuit 90.

The level-inverted signal of a first forcing shutoff signal OCM and the level-inverted signal of an output signal FCM are inputted to the NOR circuit 91, which outputs an anomaly notification signal Fail of low level (low active) when the first forcing shutoff signal OCM or the output signal FCM is active. That is, the NOR circuit 91 is provided for notifying the fuse counter 73 or a CLC reset generator 92 described below that first forcing shutoff is being performed due to an overcurrent or a temperature anomaly, or that a fuse current has occurred (i.e., second forcing shutoff could be performed later).

When the anomaly notification signal Fail is active, the fuse counter 73 increments its count value one by one at times corresponding to down edges of the count signal OvF7 as long as the second forcing shutoff signal Fuse is nonactive (i.e., unless and until it overflows). When the counter overflows, it outputs an active second forcing shutoff signal Fuse so that a forcing shutoff operation for the power MOSFET 14 is performed. At the same time, the count operation according to the count signal OvF7 terminates, and the forcing shutoff state is maintained (This is second forcing shutoff).

On the other hand, the FCC reset generator 86 resets the count value of the fuse counter 73 to "0", when the following reset condition 4 or 5 is satisfied.

Reset Condition 4: The reset signal generator 75 outputs an active reset signal RST; and Reset Condition 5: The second forcing shutoff signal Fuse is nonactive (or high level) and the clear signal CLR is active (i.e., the clear counter 72 has overflowed).

An OC threshold designation generator 93 obtains the count values of the fuse counter 73 and the FR counter 71, and sequentially outputs threshold designation signals OCL0-OCL5 of low level (low active) based on the count value of the higher 5 bits of the FR counter 71 (i.e., the time counted by the FR counter) as shown in FIG. 6. Thereby, the FETs 61a-61f of the threshold voltage generator 52 are turned on selectively and sequentially, so that the first anomaly threshold voltage Voc (and also the first anomaly threshold current ILoc) are decreased stepwise with time (i.e., according to the counted time). When the count value of the fuse counter 73 is equal to or larger than eight, the OC threshold designation generator 93 invariably outputs an active threshold designation signal OCL5, so that the first anomaly threshold voltage Voc (and also the first anomaly threshold current ILoc) are maintained at the lowest level.

d. Clear Counter

If a normal state, in which neither a current anomaly nor a temperature anomaly is detected (i.e., the load current IL is a normal level lower than the second anomaly threshold current ILfc and the first anomaly threshold current ILoc), continues for a predetermined reference NORMAL duration without overflow being reached after the fuse counter 73 starts the count, the clear counter 72 as a normal duration accumulator circuit mainly outputs a clear signal CLR of low level (low active) so that the FUSE time (i.e., count value) of the fuse counter 73 is reset to the initial value "0". The reference NORMAL duration is determined based on the time taken for elimination of the overheat state of the load or the like after elimination of a fuse current or overcurrent state, for example.

Specifically, the clear counter 72 is a 5-bit counter, for example, and increments its count value one by one at times corresponding to down edges of the count signal OvF7 from the FR counter 71, for example. Unless the clear counter is reset, it overflows and outputs an active clear signal CLR, when 512 milliseconds (i.e., an example of the reference NORMAL duration, a first time and a second time) are reached. The CLC reset generator 92 resets the count value of the clear counter 72 to "0", when any of the following reset conditions 6-8 is satisfied.

Reset Condition 6: The reset signal generator 75 outputs an active reset signal RST;

Reset Condition 7: The second forcing shutoff signal Fuse is nonactive (i.e., second forcing shutoff has not been performed yet) and the anomaly notification signal Fail is active; and Reset Condition 8: The second forcing shutoff signal Fuse is active (i.e., second forcing shutoff is being performed) and the control signal On is active.

The control logic portion 27 further includes an OR circuit 87 for outputting the output signal Off, to which the inverted signal of a clear signal CLR and the inverted signal of a reset signal RST are inputted. The OR circuit 87 outputs an output signal Off of high level so that the internal ground generator 23 terminates its operation, when the clear signal CLR or the reset signal RST is active.

f. Invalidation Circuit

As described above, the NAND circuit 81 receives the level-inverted signal of a control signal On and the forcing shutoff signal Inhibit described below (which is low level when forcing shutoff for the power MOSFET 14 should be performed). The output signal thereof is level-inverted and inputted to the NAND circuits 80 and 82. According to this construction, the NAND circuit 81 outputs a high-level output signal, when a nonactive control signal On (OFF signal) is received. Thereby, the outputs of the NAND circuits 80, 82 are maintained high level so that the OC memory 76 or the FC memory would not turn to the set state, even if the current anomaly detector 53 outputs an active overcurrent signal OC or an active fuse current signal FC, or the overheat detector 25 outputs an active temperature anomaly signal OT. That is, the active overcurrent signal OC, fuse current signal FC and temperature anomaly signal OT are invalidated (or masked).

In the case when the load 11 is an L-load, for example, the source voltage of the power MOSFET 14 may be pulled to the negative side due to the surge voltage of the load 11, when the power MOSFET 14 is turned OFF in response to a nonactive control signal On (OFF signal). Therefore, the second and third anomaly threshold voltages Vfc and Vop, which are generated based on the source voltage, may be also negative. Then, an active fuse current signal FC or breaking indication signal OP as an anomaly signal may be outputted from the current anomaly detector 53, even if a fuse current or a wire-breaking anomaly has not occurred. However, in the present embodiment, the invalidation circuit invalidates an active fuse current signal FC when a nonactive control signal On is inputted. Thereby, the fuse counter 73 is prevented from incrementing the count, and consequently a second forcing shutoff operation can be prevented from being performed.

g. Filter Circuit

A filter circuit includes a counter circuit comprising a plurality of memory circuits (e.g., two memory circuits 100, 101 (e.g., D flip-flops) in the present embodiment) serially connected to one another. The internal ground GND2 is applied to the D-terminal of the memory circuit 100, and the Q-terminal thereof is connected to the D-terminal of the next memory circuit 101. The clear signal CLR is inputted to the set terminals of both memory circuits 100, 101, and an output signal from a NOR circuit 102 is inputted to the reset terminals. The level-inverted signal of a reset signal RST from the reset signal generator 75 and the breaking indication signal OP are inputted to the NOR circuit 102.

According to this construction, while the reset signal RST is nonactive and the breaking indication signal OP is active, the filter circuit outputs a breaking anomaly signal OPF of low level (low active) from the Q terminal of the memory circuit 101 if it has received an active clear signal CLR two or more times (e.g., two times in the present embodiment). On the other hand, the filter circuit is reset when the following reset condition 9 or 10 is satisfied.

Reset Condition 9: The reset signal generator 75 outputs an active reset signal RST; and Reset Condition 10: The breaking anomaly signal OPF is nonactive (or high level).

That is, the breaking anomaly signal OPF is not immediately turned to active, if the current detector 24 outputs an active breaking indication signal OP. It is turned to active, when an active clear signal CLR has been received two times from the clear counter 72 (i.e., when at least the reference NORMAL duration has elapsed since the output of the active breaking indication signal OP). Thus, the clear counter 72, the memory circuits 100, 101 (and the like) function as "first and second filter circuits".

The breaking anomaly signal OPF outputted from the Q-terminal of the memory circuit 101 is level-inverted, and inputted to a NAND circuit 103. A bit signal corresponding to one bit of the FR counter 71 is inputted to the NAND circuit 103, so that the NAND circuit 103 outputs a pulsed breaking anomaly signal OPFP, which is pulsed according to the inverted level of the bit signal, when the breaking anomaly signal OPF is active. In the present embodiment, the bit signal FRC7 corresponding to the most significant bit is inputted to the NAND circuit 103, and thereby the pulsed breaking anomaly signal OPFP is outputted in 32 millisecond periods with a duty ratio of 50%.

On the other hand, when the breaking anomaly signal OPFP turns to nonactive, the filter circuit immediately outputs a nonactive (high-level) breaking anomaly signal OPFP (as a normal signal) indicating a normal state. The level-inverted signal of the breaking anomaly signal OPFP and the level-inverted signal of a forcing shutoff signal Inhibit from the NOR circuit 84 are outputted as a diagnostic signal Diag via a NOR circuit 104, and provided for the diagnostic output portion 26. The diagnostic output portion 26 provides a pulsed diagnostic output on the diagnostic output terminal P7, when the breaking anomaly signal OPF is active. It provides a stepwise diagnostic output when the forcing shutoff signal Inhibit is active. According to this construction, a wire-breaking anomaly can be distinguished from the other anomalies (i.e., an overcurrent, a fuse current and a temperature anomaly) by the diagnostic output.

(Gate Driver)

The control signal On, the output signal FCM and the forcing shutoff signal Inhibit are inputted from the control logic portion 27 to the gate driver 28. The gate driver 28 includes a charge pump (not shown) connected between the power supply terminal P2 and the gates of the power MOSFET 14 and sense MOSFET 18, and further includes a discharge FET (not shown) connected between the gates and sources of the power MOSFET 14 and sense MOSFET 18.

When the gate driver 28 receives an active control signal On (ON signal) from the control logic portion 27, the charge pump 90 solely operates so as to apply a higher voltage, generated from the power supply voltage Vcc, to between the gate and source of each of the power MOSFET 14 and the sense MOSFET 18. Thus, a charging operation is performed for turning ON the power MOSFET and the sense MOSFET, resulting in a conductive state. On the other hand, when the gate driver 28 receives a nonactive control signal On (OFF signal) from the control logic portion 27 or an active forcing shutoff signal Inhibit (indicating that first or second forcing shutoff should be performed), the charge pump 90 discontinues generation of a higher voltage while the discharge FET is solely turned on, so that the charge between the gate and source of each of the power MOSFET 14 and the sense MOSFET 18 is released. Thus, a discharging operation or a shutoff operation is performed.

2. Operation According to the Present Embodiment

Figure 7:
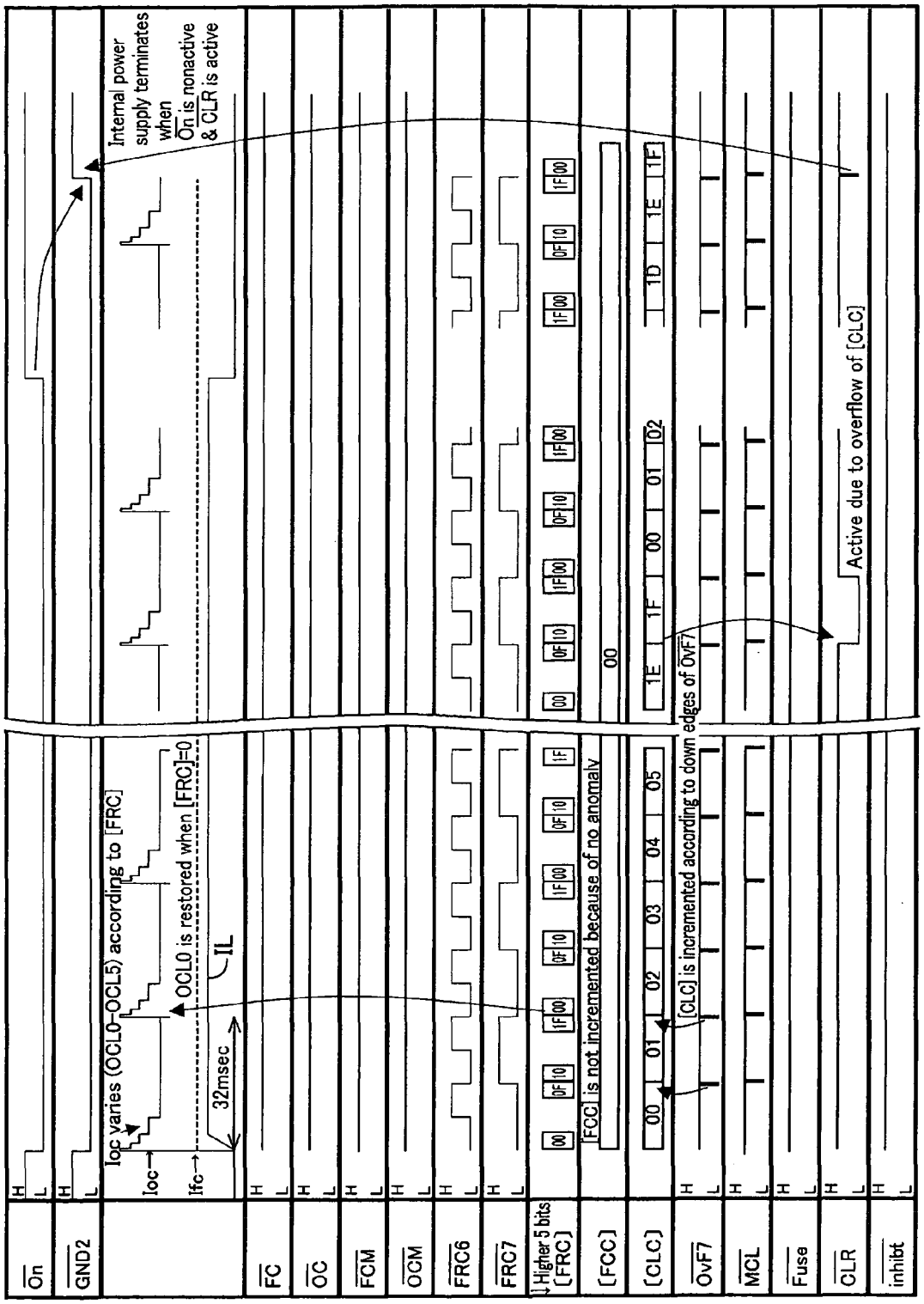
FIG. 7 is a timing chart of various signals for illustrating an operation of the power supply controller (during a normal state)
Figure 8:
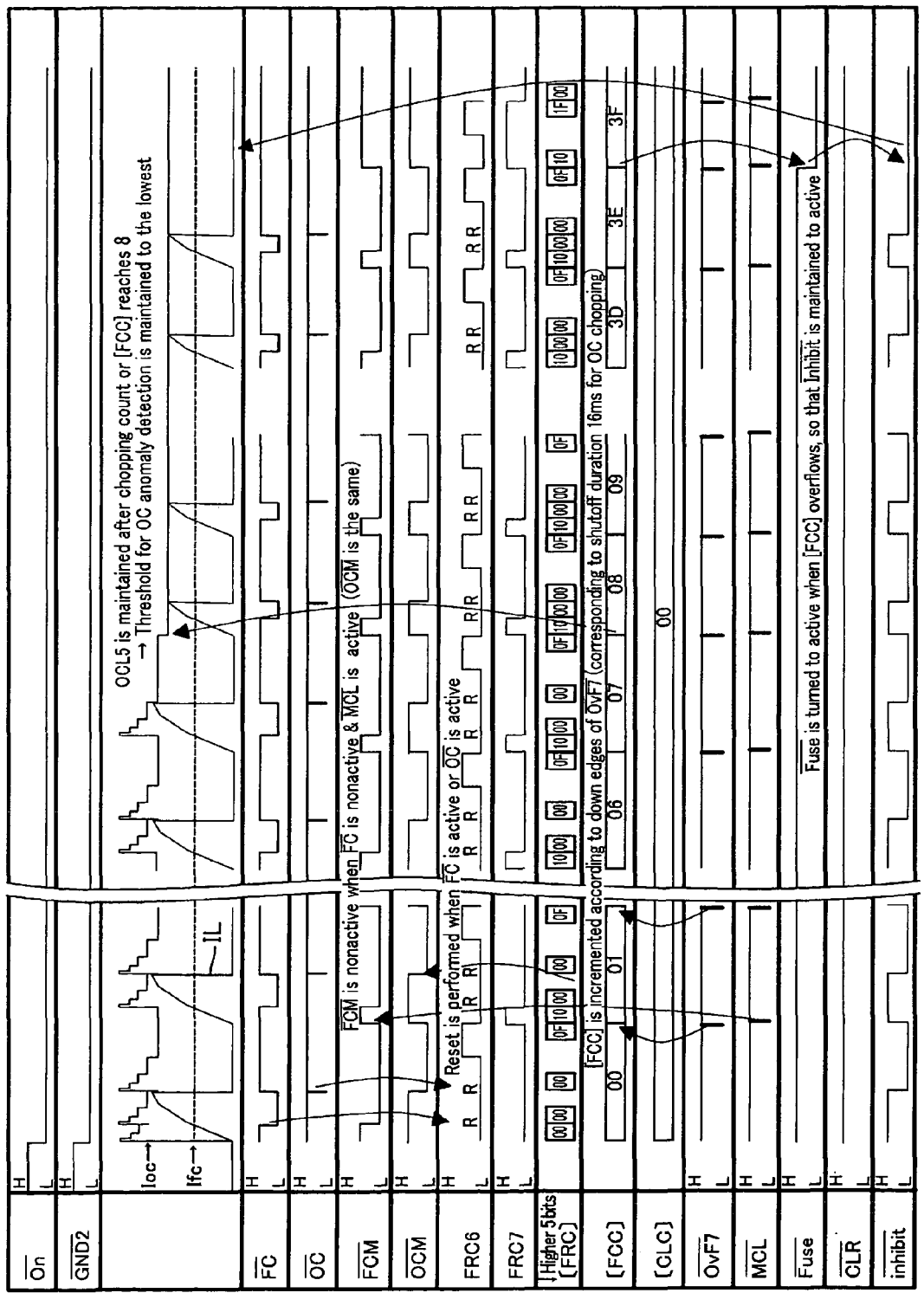
FIG. 8 is a timing chart of various signals for illustrating an operation of the power supply controller (during an overcurrent)
Figure 9:
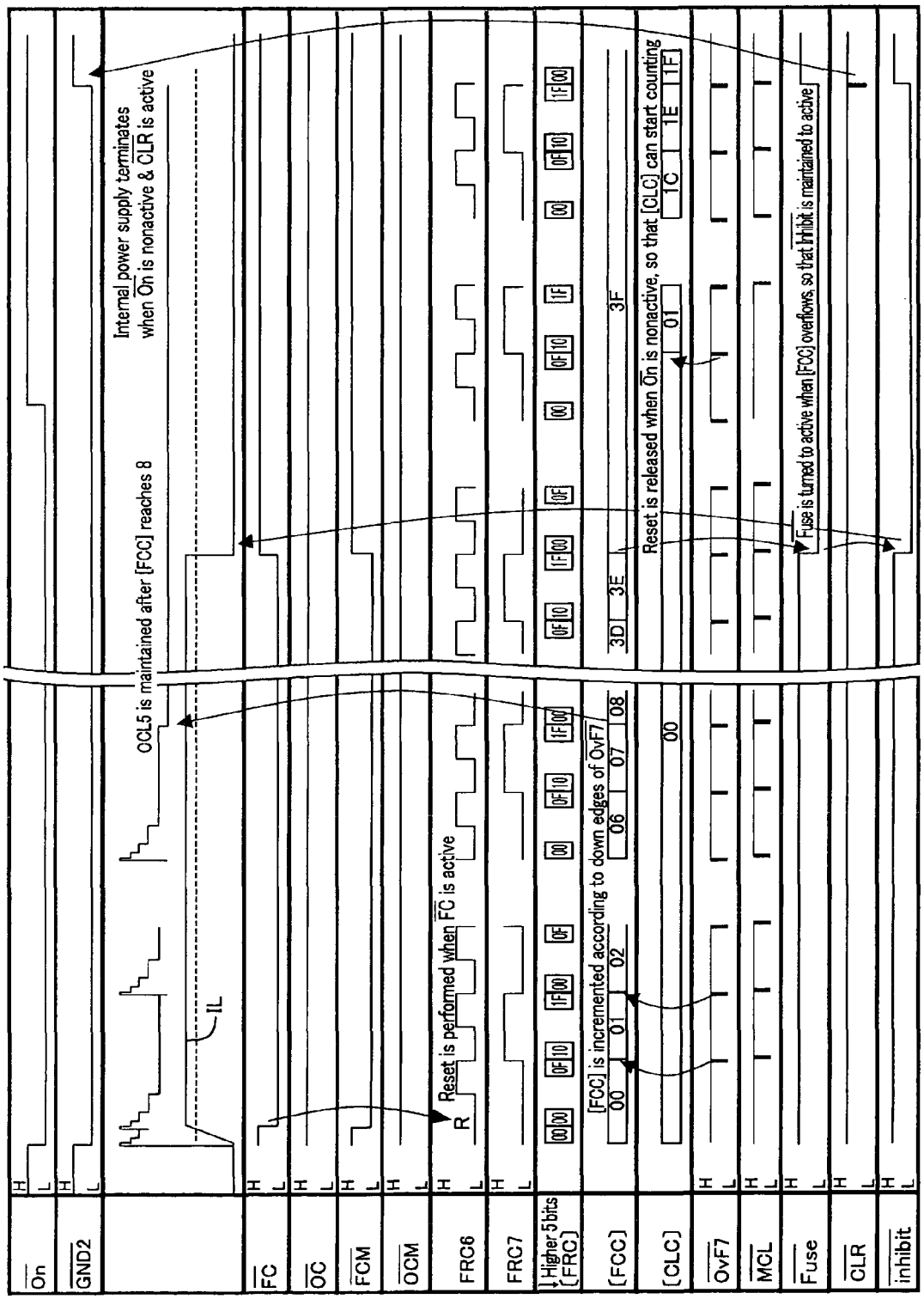
FIG. 9 is a timing chart of various signals for illustrating an operation of the power supply controller (during a fuse current).

FIGS. 7 to 9 are timing charts of various signals for explanation of the operation of the power supply controller 10. FIG. 7 relates to an operation during a normal state. FIG. 8 relates to an operation during an overcurrent occurrence. FIG. 9 relates to an operation during a fuse current occurrence. In the drawings, [FRC] represents the count value of the higher 5 bits of the FR counter 71. [FCC] represents the count value of the fuse counter 73. [CLC] represents the count value of the clear counter 72. The count values are shown in hexadecimal (e.g. A=10, B=11, C=12 and the like). Further, FRC7 represents the most significant bit of the FR counter 71, and how the most significant bit alternates between high and low levels is shown. FRC6 represents the second significant bit of the FR counter 71, and how the second significant bit alternates between high and low levels is shown. "R" in the drawings means "reset".

(Normal Operation)

When the power supply controller 10 receives an active control signal On, the internal ground generator 23 generates an internal ground GND2. When the internal ground GND2 stabilizes, the reset signal RST outputted from the reset signal generator 75 turns from active to nonactive, so that the reset states of the counters 71-73 are released.

The active control signal On is provided for the gate driver 28 via the control logic portion 27. Then, the power MOSFET 14 and the like turn ON resulting in a conductive state. The FR counter 71 begins to count according to the clock signal CLK from the oscillator 74. During the normal operation, an active set signal OC1 is not outputted from the NAND circuit 80 (i.e., reset condition 2 is not satisfied), and the output signal FCM of the FC memory 78 is not level-inverted from high to low level (i.e., the reset condition 3 is not satisfied). Therefore, the FR counter 71 repeatedly counts to 32 milliseconds without being reset in the middle of the count (See [FRC] in FIG. 7). At the same time, the OC threshold designation generator 93 sequentially outputs active threshold designation signals OCL0-OCL5 depending on the count value of the higher 5 bits of the FR counter 71. Thereby, an operation, which decreases the first anomaly threshold current ILoc stepwise with time beginning with the initial level higher than an inrush current, is iterated in 32 millisecond periods.

When an active control signal On is inputted, an inrush current higher than the second anomaly threshold current ILfc may pass into the power MOSFET 14. However, the first anomaly threshold current ILoc is then set to the initial level higher than the inrush current, and thereby a first forcing shutoff operation due to the inrush current can be prevented from being performed for the power MOSFET 14 and the like.

During the normal operation, the anomaly notification signal Fail is nonactive, and therefore the fuse counter 73 does not start the count (See [FCC] in FIG. 7). On the other hand, the clear counter 72 increments its count value one by one at times of input of the count signal OvF7 from the FR counter 71. It is not reset in the middle of the count, since the anomaly notification signal Fail is maintained nonactive. When 512 milliseconds (i.e., the reference NORMAL duration) are reached, the counter overflows and outputs an active clear signal CLR (See [CLC] and [CLR] in FIG. 7).

When the control signal On turns from active to nonactive, the internal ground generator 23 waits for overflow of the clear counter 72 as described above if the counter has not overflowed at the time. Then, generation of the internal ground GND2 is terminated.

(Operation During Overcurrent or Fuse Current Occurrence)

If short-circuiting occurs in the load 11, the load current IL may exceed the second anomaly threshold current ILfc as shown in FIG. 8. At the time, the fuse current signal FC turns to active, so that the output signal FCM of the FC memory 78 is level-inverted from high to low level and the count value of the FR counter 71 is reset. Thereby, the first anomaly threshold current ILoc is restored to the initial level, and thereafter is decreased stepwise again with time according to the count value of the FR counter 71 that starts the count after the reset.

When the load current IL thereafter exceeds the first anomaly threshold current ILoc, the overcurrent signal OC turns to active and the set signal OC1 from the NAND circuit 80 turns to active. Thereby, the first forcing shutoff signal OCM from the OC memory 76 turns to active. Then, a first forcing shutoff operation of the power MOSFET 14 is performed in response to an active forcing shutoff signal Inhibit. Further, the count value of the FR counter 71 is reset in response to the active set signal OC1. Thereafter, an active count signal OvF7 is outputted when a time slightly shorter than 16 milliseconds has elapsed. In response to this, the fuse counter 73 increments its count value by one (See [FCC] in FIG. 8). An active shutoff release signal MCL is outputted when the FR counter 71 has counted 16 milliseconds. Then, the OC memory 76 outputs a nonactive first forcing shutoff signal OCM so that the power MOSFET 14 is returned to ON and the forcing shutoff state is released.

If the short-circuiting in the load 11 is thereafter not eliminated, the clear counter 72 will not start the count, and the first forcing shutoff is performed repeatedly. During that time, the fuse counter 73 increments its count value one by one. If the count value [FCC] reaches seven (i.e., if the first forcing shutoff has been performed seven times), the OC threshold designation generator 93 thereafter keeps outputting an active threshold designation signal OCL5 so that the first anomaly threshold current ILoc is maintained to the lowest level.

When the fuse counter 73 has overflowed, it outputs an active second forcing shutoff signal Fuse so that the forcing shutoff operation for the power MOSFET 14 is performed. At this time, the count operation according to the count signal OvF7 is discontinued, so that the forcing shutoff state (due to the second forcing shutoff) is maintained. Note that the second anomaly threshold current ILfc is set to a level slightly higher than the rated current ILmax of the load 11. The reference FUSE time is set to a time shorter than the time taken for the electric wire 30 to emit smoke when a fuse current (i.e., a current higher than the second anomaly threshold current Ilfc), is intermittently detected at intervals shorter than the reference NORMAL duration. Therefore, a chattering short (i.e., an abnormal current that occurs in a fraction of the stranded wires of the electric wire 30 at intervals shorter than the reference NORMAL duration due to short-circuiting in the fraction of the stranded wires), can be detected without the electric wire 30 reaching smoke emission, so that the second forcing shutoff can be performed for the power MOSFET 14.

Thereafter, if the control signal On turns from active to nonactive as shown in FIG. 9, the reset state of the clear counter 72 is released. The clear counter continues to output a nonactive clear signal CLR until its overflow, so that generation of the internal ground GND2 is maintained. When the clear counter has overflowed, generation of the internal ground GND2 is terminated. Therefore, the second forcing shutoff state is maintained, even if the control signal On returns to active before the clear counter 72 overflows.

(Operation During Wire-Breaking Anomaly Occurrence)

If the third anomaly threshold current ILop is supposedly set to a fixed value, a load resistance value (i.e., a resistance value of the external circuit), based on which an active breaking indication signal OP is outputted, varies with variation of the power supply voltage Vcc. However, a wire-breaking anomaly should be determined consistently based on the same load resistance value regardless of variation of the power supply voltage Vcc, in order to accurately detect the wire-breaking anomaly.

Therefore, in the present embodiment, the third anomaly threshold current ILop (and the third anomaly threshold voltage Vop) are set so as to vary in proportion to the source voltage Vs of (or the power supply voltage Vcc for) the power MOSFET 14 in the ON state as described above. According to this construction, the third anomaly threshold current ILop decreases by half, if the power supply voltage Vcc decreases by half, for example. That is, the load resistance value, based on which a wire-breaking anomaly is detected (and which is equal to a value determined by dividing the power supply voltage Vcc by the third anomaly threshold current ILop), is the same regardless of variation of the power supply voltage Vcc. Thereby, a wire-breaking anomaly can be detected accurately. Further, a microcomputer or the like is not required.

Other Embodiments

The present invention is not limited to the embodiment explained in the above description made with reference to the drawings. The following embodiments may be included in the technical scope of the present invention, for example.

(1) In the above embodiment, the power MOSFET 14 is included as a semiconductor switching element. However, the present invention is not limited to this construction. A unipolar transistor other than the above or alternatively a bipolar transistor may be included instead.

(2) In the above embodiment, the sense MOSFET 18 is used as a current detecting element. That is, current detection is performed by a sensing method. However, the present invention is not limited to this construction. The current detection may be performed by a shunt method. For example, a shunt resistor is provided on the current supply line, so that the load current can be detected based on the voltage drop thereon.

(3) In the above embodiment, various current anomalies are detected by voltage comparison. However, the present invention is not limited to this construction. The current anomalies may be detected by current comparison. For example, an FET is provided so that the output end of the sense current Is (i.e., the output side of the source potential controller 51) is connected to the input side (e.g., drain in the case of an N-channel type) of the FET. The threshold voltage Voc (or, Vfc or Vop) is applied to the gate of the FET so that a current (threshold current) corresponding to the threshold voltage Voc (or, Vfc or Vop) can pass therethrough. According to this construction, a current as an anomaly signal is outputted from the connecting point between the input side of the FET and the output end of the sense current Is, when the sense current Is exceeds or falls below the threshold current.

(4) In the above embodiment, a voltage-dividing circuit including threshold setting resistors 64a-64c is used as a threshold adjustment circuit. However the present invention is not limited to this construction, but rather may be any construction in which the thresholds are changed depending on the output-side voltage of the semiconductor switching element. For example, switching elements are provided, and the output-side voltage of the semiconductor switching element is applied to the control terminals of the switching elements so that a current corresponding to the output-side voltage can pass through each switching element. This current can be used as a threshold current. Further, resistors may be additionally provided so that the currents from the above switching elements pass through the resistors. The terminal voltage of each resistor can be used as a threshold voltage.

(5) In the above embodiment, the first and second filter circuits use the time counted by the clear counter 72. However, the present invention is not limited to this construction. Additional counter circuits may be separately provided for counting the first and second time, so that the counted time thereof can be used instead.

The invention claimed is:

1. A power supply controller comprising:
a semiconductor switching element disposed on a current supply line from a power source to a load;
a current detecting element configured to detect a load current passing through said semiconductor switching element;
a breaking anomaly detecting circuit configured to output a breaking anomaly signal if it is determined based on a detection signal from said current detecting element that a load current passing through said semiconductor switching element is lower than a breaking anomaly threshold while said semiconductor switching element is in an ON state;
a threshold adjustment circuit configured to change said breaking anomaly threshold according to an output-side voltage of said semiconductor switching element; and
a switch control circuit configured to turn on said semiconductor switching element based on an input of an ON signal;
wherein said breaking anomaly detecting circuit includes a first filter circuit configured to suppress an output of said breaking anomaly signal until an elapsed time since an input of said ON signal reaches at least a first time.

2. The power supply controller as in claim 1,
wherein said threshold adjustment circuit is provided as a voltage-dividing circuit configured to divide the output-side voltage of said semiconductor switching element, and a load current corresponding to a divided voltage thereof is used as said breaking anomaly threshold.

3. A power supply controller comprising:
a semiconductor switching element disposed on a current supply line from a power source to a load;

a current detecting element configured to detect a load current passing through said semiconductor switching element;

a breaking anomaly detecting circuit configured to output a breaking anomaly signal if it is determined based on a detection signal from said current detecting element that a load current passing through said semiconductor switching element is lower than a breaking anomaly threshold while said semiconductor switching element is in an ON state; and a threshold adjustment circuit configured to change said breaking anomaly threshold according to an output-side voltage of said semiconductor switching element, wherein said breaking anomaly detecting circuit includes a determination circuit configured to output an indication signal according to a magnitude relation between said load current and said breaking anomaly threshold, and further includes a second filter circuit configured to output said breaking anomaly signal if said determination circuit outputs an anomaly indication signal, indicating that said load current is lower than said breaking anomaly threshold, continuously for at least a second time.

4. The power supply controller as in claim 3, wherein said threshold adjustment circuit is provided as a voltage-dividing circuit configured to divide the output-side voltage of said semiconductor switching element, and a load current corresponding to a divided voltage thereof is used as said breaking anomaly threshold.

5. The power supply controller as in claim 1, wherein said breaking anomaly detecting circuit includes a determination circuit configured to output an indication signal according to a magnitude relation between said load current and said breaking anomaly threshold, and further includes a second filter circuit configured to output said breaking anomaly signal if said determination circuit outputs an anomaly indication signal, indicating that said load current is lower than said breaking anomaly threshold, continuously for at least a second time.

6. The power supply controller as in claim 5, wherein said threshold adjustment circuit is provided as a voltage-dividing circuit configured to divide the output-side voltage of said semiconductor switching element, and a load current corresponding to a divided voltage thereof is used as said breaking anomaly threshold.

7. The power supply controller as in claim 6, wherein said second filter circuit outputs a normal signal when said determination circuit outputs a normal indication signal indicating that said load current is equal to or higher than said breaking anomaly threshold.

8. The power supply controller as in claim 7, wherein said second filter circuit includes:

a timer circuit configured to repeatedly measure said second time, and output a clear signal at an end of each measurement of said second time; and a counter circuit configured to count a number of outputs of the clear signal from said timer circuit while said determination circuit is outputting said anomaly indication signal, and output said breaking anomaly signal if said counted number reaches a plural number, wherein said counted number is reset when said determination circuit outputs said normal indication signal.

* * * * *